(12) United States Patent
Buck et al.

(10) Patent No.: US 11,268,832 B2
(45) Date of Patent: Mar. 8, 2022

(54) COIL ASSEMBLY AND CORRESPONDING MEASURING ASSEMBLY

(71) Applicant: Robert Bosch GmbH, Stuttgart (DE)

(72) Inventors: Thomas Buck, Tamm (DE); Andreas Merz, Freiberg Am Neckar (DE); Oliver Krayl, Gerlingen (DE); Stefan Leidich, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 475 days.

(21) Appl. No.: 16/314,426

(22) PCT Filed: Jun. 12, 2017

(86) PCT No.: PCT/EP2017/064304
§ 371 (c)(1),
(2) Date: Dec. 30, 2018

(87) PCT Pub. No.: WO2018/001711
PCT Pub. Date: Jan. 4, 2018

(65) Prior Publication Data
US 2019/0154467 A1     May 23, 2019

(30) Foreign Application Priority Data

Jun. 30, 2016  (DE) .................. 10 2016 211 981.8

(51) Int. Cl.
*G01D 5/22* (2006.01)
*G01D 5/243* (2006.01)
(Continued)

(52) U.S. Cl.
CPC ................ *G01D 5/22* (2013.01); *G01D 5/20* (2013.01); *G01D 5/243* (2013.01); *H05K 1/116* (2013.01);
(Continued)

(58) Field of Classification Search
CPC ............ G01D 5/22; G01D 5/20; G01D 5/243; H05K 1/116; H05K 1/185; H05K 1/0298;
(Continued)

(56) References Cited

U.S. PATENT DOCUMENTS 5,691,628 A  * 11/1997 Martin .................. H02M 5/293
323/237
6,534,970 B1     3/2003 Ely et al.
(Continued)

FOREIGN PATENT DOCUMENTS

DE   10 2008 012 922 A1   9/2009
EP      1 422 492 A1      5/2004
(Continued)

OTHER PUBLICATIONS

International Search Report corresponding to PCT Application No. PCT/EP2017/064304, dated Sep. 29, 2017 (German and English language document) (5 pages).

*Primary Examiner* — Son T Le
*Assistant Examiner* — Dustin R Dickinson
(74) *Attorney, Agent, or Firm* — Maginot, Moore & Beck LLP

(57) ABSTRACT

A coil assembly includes a coil winding and a multilayer printed circuit board. The coil winding has multiple loops that are arranged in different layers of the printed circuit board and form a main magnetic field with a main measuring direction perpendicular to a main plane of the printed circuit board. The loops arranged in different layers are electrically connected together via at least one via. The printed circuit board has at least four vias or a whole-number multiple of four vias that form an equal number of reverse current paths and forward current paths between the loops of the coil winding. Each pair of vias with the same current path direction is arranged point-symmetrically relative to a common mirror point such that magnetic loops that are formed (Continued)

on printed circuit board secondary planes arranged perpendicularly to the main plane have opposite directions and compensate for one another.

19 Claims, 14 Drawing Sheets

(51) Int. Cl.
    *G01D 5/20*     (2006.01)
    *H05K 1/11*     (2006.01)
    *H05K 1/18*     (2006.01)

(52) U.S. Cl.
    CPC ....... *H05K 1/185* (2013.01); *H05K 2201/086* (2013.01); *H05K 2201/1003* (2013.01)

(58) Field of Classification Search
    CPC ............. H05K 1/165; H05K 2201/086; H05K 2201/1003; G01R 33/0041; G01R 33/0023; G01R 33/0052; G01R 27/2611
    See application file for complete search history.

(56) References Cited

U.S. PATENT DOCUMENTS

| | | | |
|---|---|---|---|
| 6,803,773 B1 * | 10/2004 | Cyran | ................ G01R 27/2611 |
| | | | 324/654 |
| 2014/0005820 A1 | 1/2014 | Roehm | |
| 2015/0035543 A1 * | 2/2015 | Candy | ................ G01R 27/2611 |
| | | | 324/602 |

FOREIGN PATENT DOCUMENTS

| | | |
|---|---|---|
| EP | 2 570 776 A2 | 3/2013 |
| JP | 2006-509189 A | 3/2006 |
| JP | 2009-083039 A | 4/2009 |
| JP | 2009-540277 A | 11/2009 |
| JP | 2013-058754 A | 3/2013 |
| WO | 2013/125610 A1 | 8/2013 |
| WO | 2013/136936 A1 | 9/2013 |

* cited by examiner

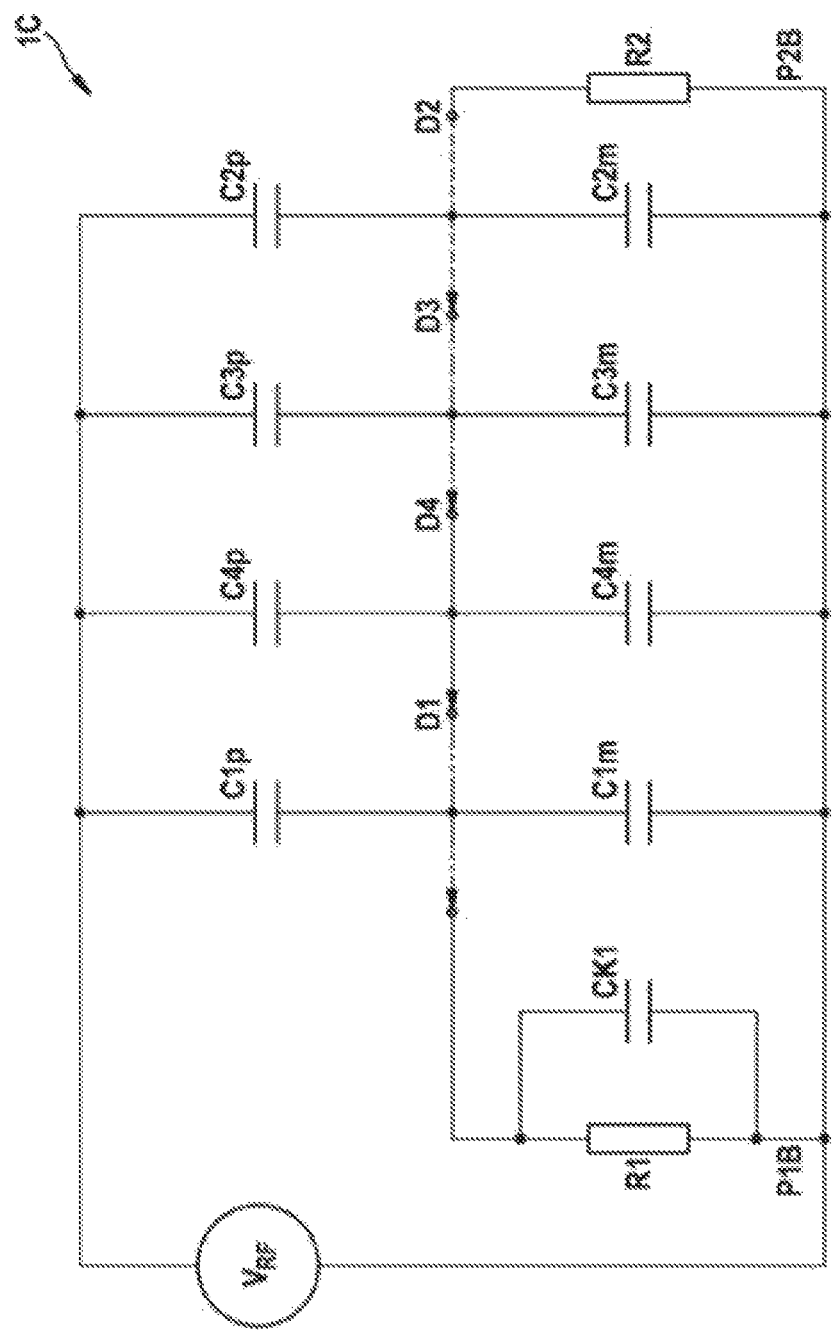

COIL ASSEMBLY AND CORRESPONDING MEASURING ASSEMBLY

This application is a 35 U.S.C. § 371 National Stage Application of PCT/EP2017/064304, filed on Jun. 12, 2017, which claims the benefit of priority to Ser. No. DE 10 2016 211 981.8, filed on Jun. 30, 2016 in Germany, the disclosures of which are incorporated herein by reference in their entirety.

BACKGROUND

The disclosure is based on a coil assembly and a measuring assembly having such a coil assembly.

Various measuring assemblies for determining an inductance of one or more sensor coils of a measuring coil assembly of an eddy current sensor by means of a resonant circuit are known from the prior art. It is possible to conclude easily on the measured angle of rotation on the basis of the inductances of individual coils. Generally, the determination of an inductance is performed by measuring and integrating a resonant frequency of an LC oscillator circuit, wherein the resonant frequency is dependent on the inductance. The measurement of the frequency of the LC oscillator can be implemented with very little complexity involved in an ASIC or microcontroller. Correspondingly, the detected resonant frequency can also be influenced by an externally induced voltage, with the result that the resonant frequency is no longer only dependent on the LC resonance condition, but also on the frequency of the external interference signal inducing the voltage. By splitting the sensor coils into two parts and inverting the winding sense, this coupling-in can be reduced. By virtue of this measure, however, the inductance is generally also reduced, but this inductance critically determines the coil Q factor and therefore the frequency stability.

A real coil assembly is never completely planar and has a plurality of regions in which external fields can induce voltages. Thus, in the case of single-layered or double-layered coils, significant sensitivities with respect to magnetic interference fields may be present if there is an interference field within the coil assembly which has not been compensated for and which is generally caused by the structure of the vias in a multilayered printed circuit board. The vias are used to make contact between the coil and an evaluation circuit. Considerable coupling-in of signals by electrical fields can occur if the coil assembly does not have the same impedance at both connections and if a grounded area is arranged behind the coil assembly.

Attempts are also being made to reduce the sensitivity with respect to homogeneous external fields in the main measurement direction. These attempts are based on the idea that the eddy current is a local effect of the near field, whereas the interference field can be considered to be a homogeneous far field. DE 10 2008 012 922 A1 discloses, for example, an inductive planar angle sensor having a stator, which comprises at least one excitation element and at least one reception element, a rotor and an evaluation circuit. The excitation element is in the form of a coil having a first outer winding and an oppositely directed second winding arranged therein with a spacing. Thus, the excitation element has two coils, which generate opposite electromagnetic fields when a voltage is applied. Depending on the requirement for the field strength, a plurality of parallel windings can be arranged in different layers of a printed circuit board, wherein the ends of the windings are connected electrically to one another by means of a via.

SUMMARY

The coil assembly having the features of the disclosure and the measuring assembly having the features of the disclosure have the advantage that coupling effects of external magnetic interference sources can at least be reduced and, in an ideal case, can be completely avoided. Owing to the point symmetry in pairs of the vias, all of the interference fields in the secondary planes are oriented in the opposite direction and thus compensate for one another. This applies both in the two directions orthogonal to the main direction and, owing to the superimposition principle, also to any other direction in the main plane.

Embodiments of the disclosure can be used, for example, for angle or linear sensors having multilayered printed circuit boards. Theoretically, the design can be such that there is complete immunity to all homogeneous magnetic fields which are generated in secondary planes arranged perpendicular to the main plane and to electrical fields built up outside the main plane. This excludes the actual detection direction or main direction, where coupling-in for implementation of the measurement principle takes place.

Embodiments of the present disclosure provide a coil assembly having a coil winding and a multilayered printed circuit board. The coil winding has a plurality of loops, which are arranged in different layers of the printed circuit board and form a main magnetic field having a main measurement direction perpendicular to a main plane of the printed circuit board. The loops arranged in different layers are connected electrically to one another by means of at least one via. In order to compensate for magnetic interference fields, the printed circuit board has at least four vias or an integral multiple of four vias, which, between the loops of the coil winding, form an identical number of downward current paths and upward current paths. In each case two vias with the same current path direction are arranged point-symmetrically with respect to a common mirror point, with the result that magnetic interference fields which are formed in secondary planes of the printed circuit board which are arranged perpendicular to the main plane have opposite directions and compensate for one another.

In addition, a measuring assembly having an amplifier and a resonant circuit is proposed, said resonant circuit comprising at least one capacitance and a measuring coil assembly, which is embodied as a coil assembly in accordance with the disclosure. In this case, an output signal of the amplifier represents, as measurement signal, an inductance and/or change in inductance of the measuring coil assembly.

By virtue of the measures and developments listed in the dependent claims, advantageous improvements of the coil assembly specified in independent patent claim 1 and of the measuring assembly having such a coil assembly specified in independent patent claim 1 are possible.

Of particular advantage is the fact that the at least four vias can be arranged along a common straight line. In addition, the vias arranged along the common straight line can, in a particularly advantageous embodiment, have as small a spacing from one another as possible, with the result that the effects of inhomogeneous interference fields can be reduced.

In principle, the in each case two vias with the same current path direction can be mirrored at any desired point. In a further advantageous configuration of the coil assembly, the vias arranged point-symmetrically in pairs can be mirrored at the center of gravity of the coil assembly as mirror point, which can be predetermined by a common point of intersection between connecting straight lines of the vias arranged point-symmetrically in pairs. In addition, an angle between two connecting straight lines can have any desired value between 0 and 360°.

In a further advantageous configuration of the coil assembly, the coil winding can electrically connect in each case a via in the form of a downward current path to a via in the form of an upward current path and a via in the form of an upward current path to a via in the form of a downward current path. In order to close the coil winding, a via in the form of an upward current path is provided for each via in the form of a downward current path. In this case, each pair consisting of a first via in the form of a downward current path and a second via in the form of an upward current path is compensated for by a similar pair consisting of a first via in the form of a downward current path and a second via in the form of an upward current path, said pair being mirrored at any desired point. Furthermore, at least one first loop, which, in a first layer of the printed circuit board, electrically connects a first via in the form of a downward current path to a second via in the form of an upward current path, and at least one second loop, which, in a second layer of the printed circuit board, electrically connects the second via in the form of an upward current path to a third via in the form of a downward current path, and at least one third loop, which, in the first layer of the printed circuit board, electrically connects the third via in the form of a downward current path to a fourth via in the form of an upward current path, and at least one fourth loop, which, in the second layer of the printed circuit board, electrically connects the fourth via in the form of an upward current path to the first via in the form of a downward current path, have the same orientation.

In a further advantageous configuration of the coil assembly, the electrical links between the vias in the form of downward current paths and the vias in the form of upward current paths and/or between the vias in the form of upward current paths and the vias in the form of downward current paths have any desired number of loops, wherein the loops do not have a point of intersection with the connecting line between the vias in the form of upward current paths in order to retain the topology.

In a further advantageous configuration of the coil assembly, the printed circuit board has a connection terminal having four connection contacts, which are each arranged point-symmetrically in pairs with respect to the common mirror point, wherein two connection contacts are in the form of downward current paths and two connection contacts are in the form of upward current paths. In this case, a first connection contact embodied as a downward current path and a second connection contact in the form of an upward current path can each be in the form of coil connections in a third layer, and a third connection contact embodied as a downward current path and a fourth connection contact in the form of an upward current path can each be in the form of a compensation contact. The loop through the two compensation contacts generates, in a magnetic interference field, a voltage of opposite polarity which can compensate for the voltage induced by the same magnetic interference field at the coil connections. In addition, the first connection contact and the second connection contact are looped into a first link between two vias and interrupt said link. In this case, the third connection contact and the fourth connection contact are looped into a corresponding link, mirrored at the common mirror point, between two vias and interrupt said link, wherein the third connection contact and the fourth connection contact are connected electrically to one another in the third layer.

In a further advantageous configuration of the coil assembly, the connection terminal has four additional vias, which form the connection contacts. In order to simplify the design and to reduce the number of vias, the connection terminal can alternatively only have two additional vias, wherein an additional via and a via of the coil winding can each form a connection contact, and an additional via and a via of the coil winding can each form a compensation contact.

In an advantageous configuration of the measuring assembly, the resonant circuit can be embodied as a Pi-LC network having two capacitances, between which the measuring coil assembly can be arranged. This enables simple and inexpensive implementation since corresponding circuits are available as mass-produced products.

In a further advantageous configuration of the measuring assembly, the amplifier can be embodied as a simple logic inverter, whose input can be connected to a first side of the resonant circuit, and whose inverting output outputs the measurement signal, which can be fed back to a second side of the resonant circuit via a nonreactive resistance.

Alternatively, the amplifier can be embodied as a differential amplifier, whose inverting input can be connected to a first side of the resonant circuit, and whose noninverting input can be connected to a second side of the resonant circuit (SK2), wherein an inverting output can be fed back to the first side of the resonant circuit via a first nonreactive resistance, and a noninverting output can output the measurement signal, which can be fed back to the second side of the resonant circuit via a second nonreactive resistance. In the case of this symmetrical oscillator circuit, the differential amplifier detects the typically similarly induced interference signals at both connections of the coil assembly and feeds back a common-mode signal to the differential amplifier inputs, with the result that the interference signals, in an ideal case, do not have any influence on the output signal. It can be demonstrated that the real effect is "zero" when the induced interference signals have the same amplitude and phase. As a result, the measuring assembly will also be immune to electrical fields.

Embodiments of the present disclosure and the described type of compensation of magnetic interference fields can be combined with the approach described in DE 10 2008 012 922 A1, which reduces the effect of interference fields outside the main measurement plane.

Exemplary embodiments of the disclosure are illustrated in the drawings and will be explained in more detail in the description below. In the drawings, the same reference symbols denote components or elements which perform the same or similar functions.

BRIEF DESCRIPTION OF THE DRAWINGS

FIG. 14 shows a schematic illustration of the coil assembly illustrated in FIG. 13 in developed form.

DETAILED DESCRIPTION

Figure 1:
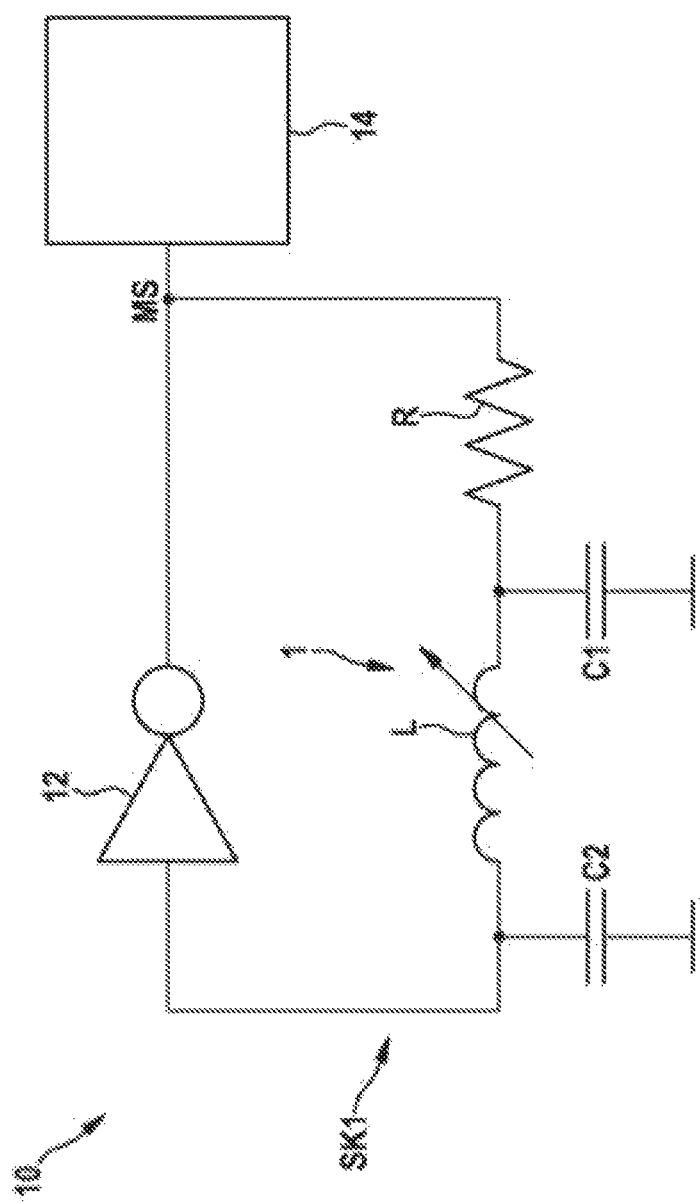
FIG. 1 shows a schematic circuit diagram of a first exemplary embodiment of a measuring assembly having a coil assembly according to the disclosure.
Figure 2:
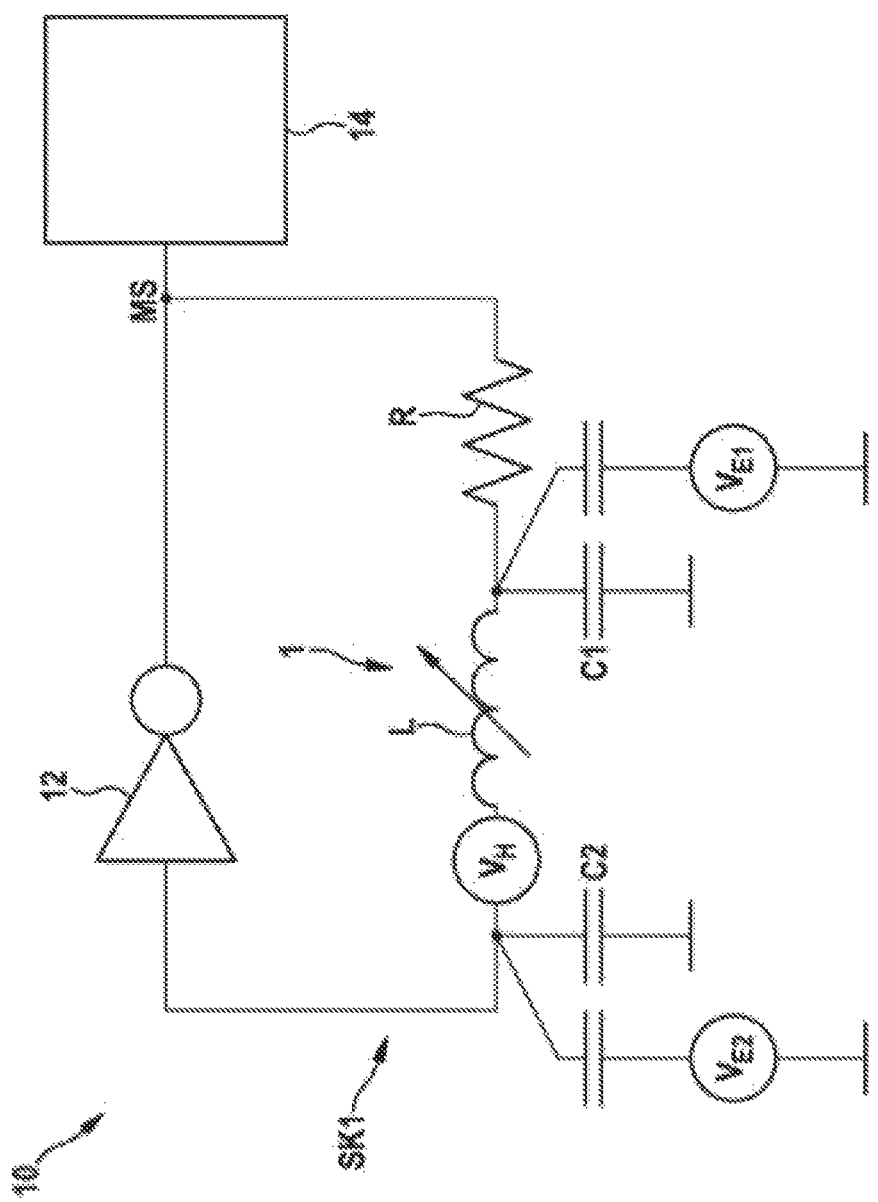
FIG. 2 shows a schematic circuit diagram of the measuring assembly from FIG. 1 with induced interference voltages.

As can be seen from FIGS. 1 and 2, the first exemplary embodiment illustrated of a measuring assembly 10 according to the disclosure comprises an inverting amplifier 12 and a resonant circuit SK1, which comprises at least one capacitance C1, C2 and a measuring coil assembly L. An output signal of the amplifier 12 represents, as measurement signal MS, an inductance and/or change in inductance of the measuring coil assembly L. In the exemplary embodiment illustrated, the resonant circuit SK1 is embodied as a Pi-LC network having two capacitances C1, C2, between which the measuring coil assembly L is arranged. The amplifier 12 is embodied as an inverter, whose input is connected to a first side of the resonant circuit SK1, and whose inverting output outputs the measurement signal MS, which is fed back to a second side of the resonant circuit SK1 via a nonreactive resistance R.

FIG. 2 shows the induced interference voltages $V_H$, $V_{E1}$, $V_{E2}$ in the circuit diagram of the measuring assembly 10. In order to avoid or reduce a shift in the natural frequency of the LC resonant circuit SK1 owing to magnetic and electrical interference fields, an interference voltage $V_H$ induced by a magnetic field is reduced virtually to "zero" because it is difficult to compensate for the interference voltage $V_H$ resulting from magnetic interference fields in any other way. This does not apply to the interference voltages $V_{E1}$, $V_{E2}$ which are caused by electrical interference fields. Theoretically, both of the interference voltages $V_{E1}$, $V_{E2}$ caused by electrical interference fields are in phase and shift the left-hand and the right-hand connection of the measuring coil assembly L in a similar manner. Nevertheless, the effect of the interference voltages $V_{E1}$, $V_{E2}$ induced by electrical interference fields can be dramatic if the resonant circuit SK1 is not symmetrical in relation to the impedances which are seen on both sides of the measuring coil assembly L. In the exemplary embodiment illustrated, a meter 14 measures a frequency of the measurement signal MS.

As can be seen from FIGS. 3 to 8, a coil assembly 1, 1A, 1B according to the disclosure, which can be used as a measuring coil assembly L in the measuring assembly 10, comprises a coil winding and a multilayered printed circuit board 3. The coil winding has a plurality of loops S1, S2, S3, S4, which are arranged in different layers LS1, LS2 of the printed circuit board 3 and form a main magnetic field Hz having a main measurement direction perpendicular to a main plane (x-y) of the printed circuit board 3. The loops S1, S2, S3, S4 arranged in different layers LS1, LS2 are connected electrically to one another by means of at least one via D1, D2, D3, D4. In this case, the printed circuit board 3 has at least four vias D1, D2, D3, D4 or an integral multiple of four vias D1, D2, D3, D4, which form, between the loops S1, S2, S3, S4 of the coil winding, an identical number of downward current paths V1, V3 and upward current paths V2, V4. Any desired magnetic interference field perpendicular to the z-axis induces in each case a voltage in the loops Hx1, Hx2, Hy1, Hy2 formed by the vias. Depending on the orientation of the loops Hx1, Hx2, Hy1, Hy2, in relation to a fixed normal current direction through the entire coil, which corresponds to the arrow direction of the electrical links D12, D23, D34, D41, these voltages either have an additive or subtractive effect on the total coil voltage. Parallel loops Hx1, Hx2 and Hy1, Hy2 in the same planes (y-x), (x-z) but with opposite direction of rotation compensate for one another completely. Geometrically, in each case two vias D1, D3; D2, D4 with the same current path direction are arranged point-symmetrically with respect to one another, with the result that magnetic loops Hy1, Hy2, Hx1, Hx2 which are formed in secondary planes (x-z), (y-z) of the printed circuit board 3 which are arranged perpendicular to the main plane (x-y) have opposite directions and compensate for one another.

Figure 3:
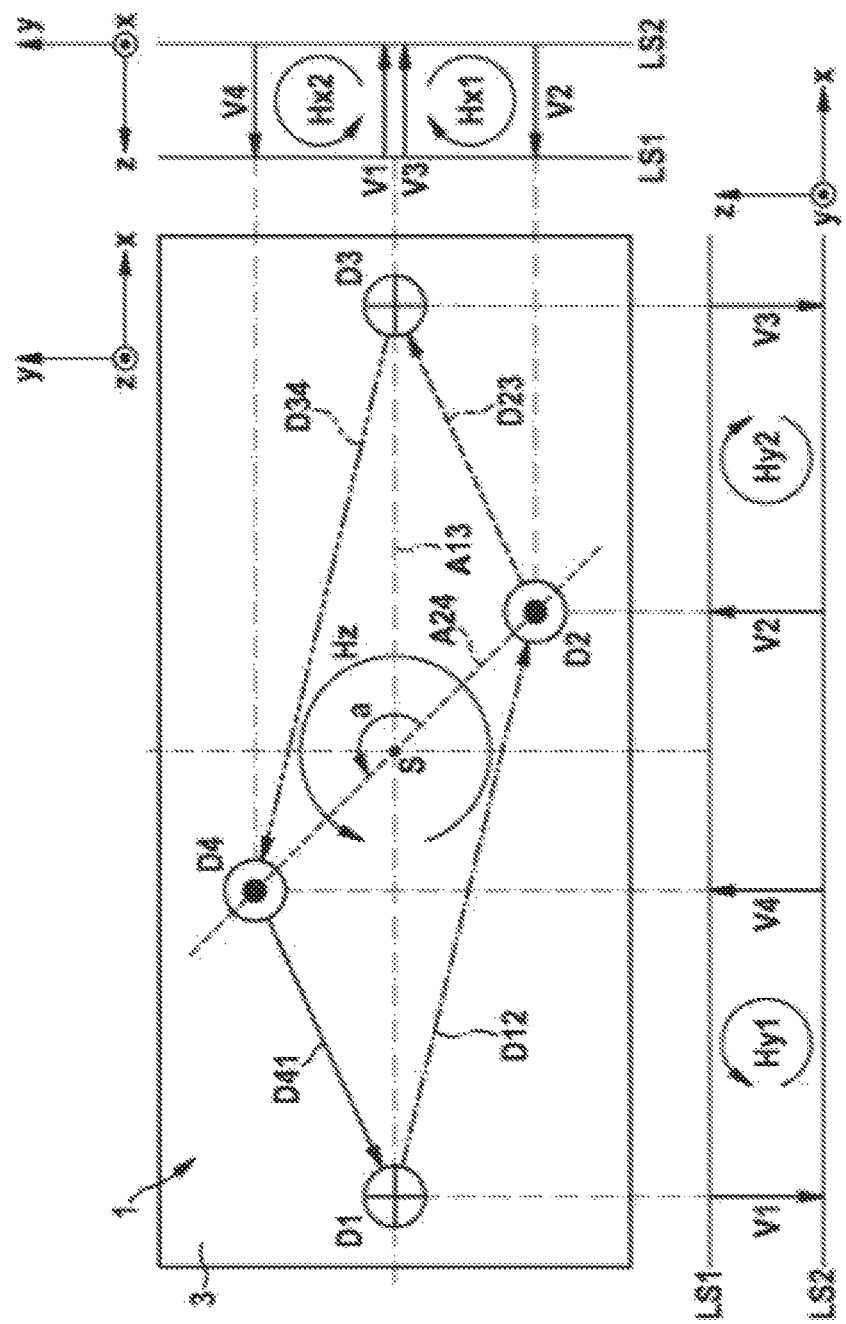
FIG. 3 shows a schematic illustration of a first exemplary embodiment of a printed circuit board for the coil assembly from FIGS. 1 and 2.

As can further be seen from FIGS. 3 to 6, the coil assembly 1 in the exemplary embodiment illustrated has four vias D1, D2, D3, D4. FIG. 3 shows the main plane (x-y) of the printed circuit board 3 having the main magnetic field Hz from above and a projection onto the two secondary planes (x-z), (y-z) extending perpendicular to the main plane (x-y) together with the resultant magnetic loops Hy1, Hy2, Hx1, Hx2 in these secondary planes (x-z), (y-z) and the orientation thereof.

As can be seen from FIG. 3, the vias D1, D2, D3, D4 are represented, depending on the predetermined current path directions, by upwardly or downwardly extending vectors, which represent the downward current paths V1, V3 or the upward current paths V2, V4. The projections into the secondary planes (x-z), (y-z) show the vectors and the resultant orientations of the corresponding magnetic loops Hy1, Hy2, Hx1, Hx2. Owing to the point symmetry in pairs of the vias D1, D2, D3, D4, the magnetic loops Hy1, Hy2, Hx1, Hx2 in a secondary plane (x-z), (y-z) are oriented in the opposite direction and thus compensate for one another. This applies both in the two directions x, y orthogonal to the main direction z and, owing to the superimposition principle, thus also to any other direction in the main plane (x-y). This means that, in the exemplary embodiment illustrated, in each case the two magnetic loops Hy1, Hy2 in the (x-z) secondary plane and the two magnetic loops Hx1, Hx2 in the (y-z) secondary plain compensate for one another. As a result, the interference voltage $V_H$ resulting from magnetic interference fields in the measuring assembly 10 can advantageously be reduced virtually to "zero".

In order to close the coil winding, a via D2, D4 in the form of an upward current path V2, V4 is provided for each via D1, D3 in the form of a downward current path V1, V3. In this case, each pair consisting of a first via D1 in the form of a downward current path V1 and a second via D2 in the form of an upward current path V2 is compensated for by a similar pair consisting of a third via D3 in the form of a downward current path V3 and a fourth via D4 in the form of an upward current path V4, which is mirrored at any desired mirror point S. In a particularly advantageous embodiment, the vias can be arranged along a common straight line and have as small a spacing from one another as possible, with the result that the effects of inhomogeneous interference fields can be reduced.

As can further be seen from FIG. 3, the vias D1, D3; D2, D4 arranged point-symmetrically in pairs are mirrored at the center of gravity of the coil assembly 1 as mirror point S, which is predetermined by a common point of intersection between connecting straight lines A13, A24 of the vias D1, D3; D2, D4 arranged point-symmetrically in pairs. An angle a between two connecting straight lines A13, A24 can have any desired value between 0 and 360°.

By virtue of the point-symmetrical approach having at least four vias D1, D2, D3, D4 or an integral multiple of four vias D1, D2, D3, D4 (n*(4*vias) where (n≥1)), the compensation criteria are met.

The loops S1, S2, S3, S4 of the coil winding on the used layers LS1, LS2 of the printed circuit board 3 electrically connect in each case a via D1, D3 in the form of a downward current path V1, V3 to a via D2, D4 in the form of an upward current path V2, V4 and a via D2, D4 in the form of an upward current path V2, V4 to a via D1, D3 in the form of a downward current path V1, V3. FIG. 3 shows the electrical links D12, D23, D34, D41 in simplified form as arrows, wherein a first and third electrical link D12, D34 are arranged in a first layer LS1 of the printed circuit board 3, and a second and fourth electrical link D23, D41 are arranged in a second layer LS2 of the printed circuit board 3. The coil winding can be interrupted at any desired one of the electrical links D12, D23, D34, D41 for the purpose of making contact, as will be described below with reference to FIGS. 7 to 14. As will be demonstrated later, there are advantages for the contact-making if an electrical link D12, D23, D34, D41 is cut in the center.

Figure 4:
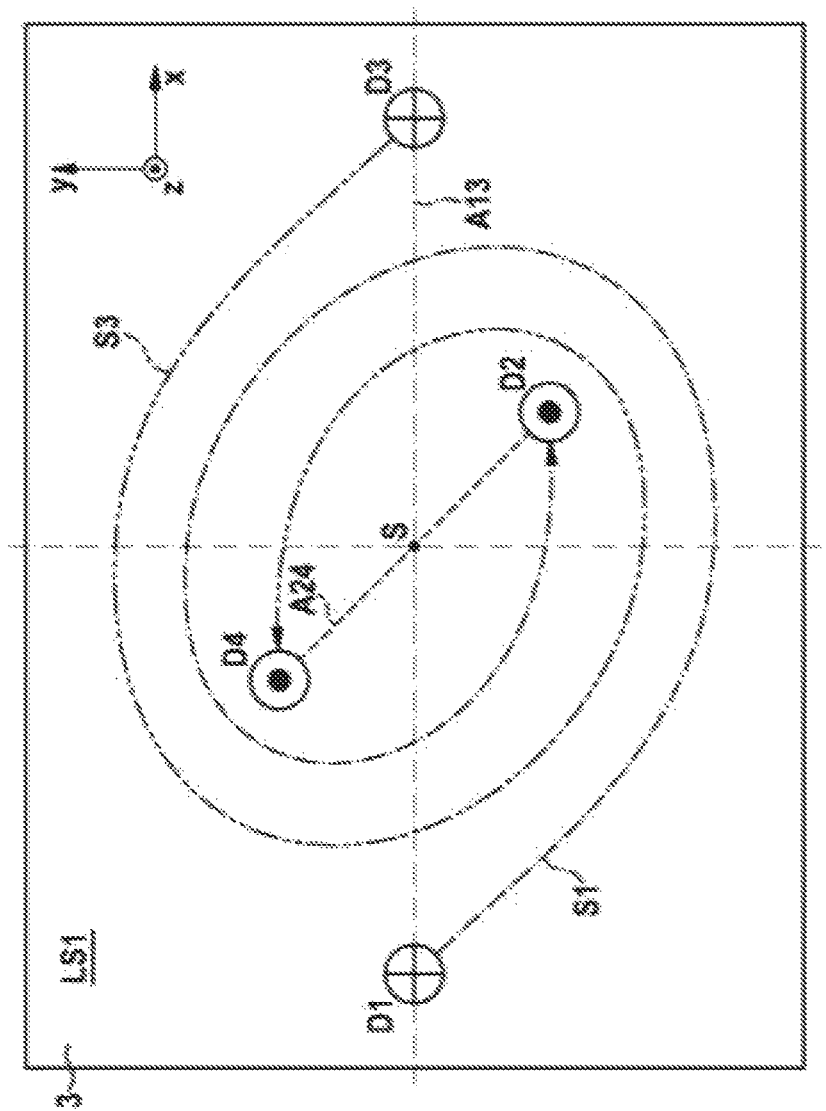
FIG. 4 shows a schematic illustration of an exemplary embodiment of a first layer of the printed circuit board from FIG. 3.
Figure 5:
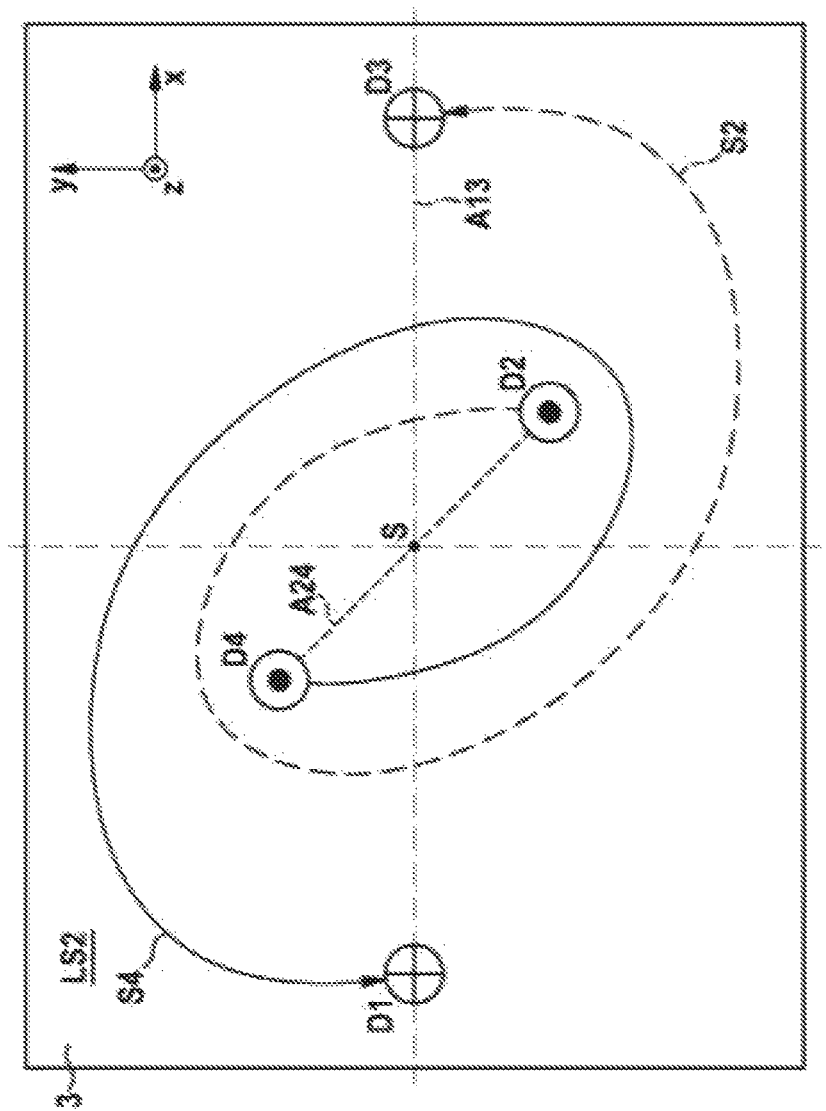
FIG. 5 shows a schematic illustration of an exemplary embodiment of a second layer of the printed circuit board from FIG. 3.
Figure 6:
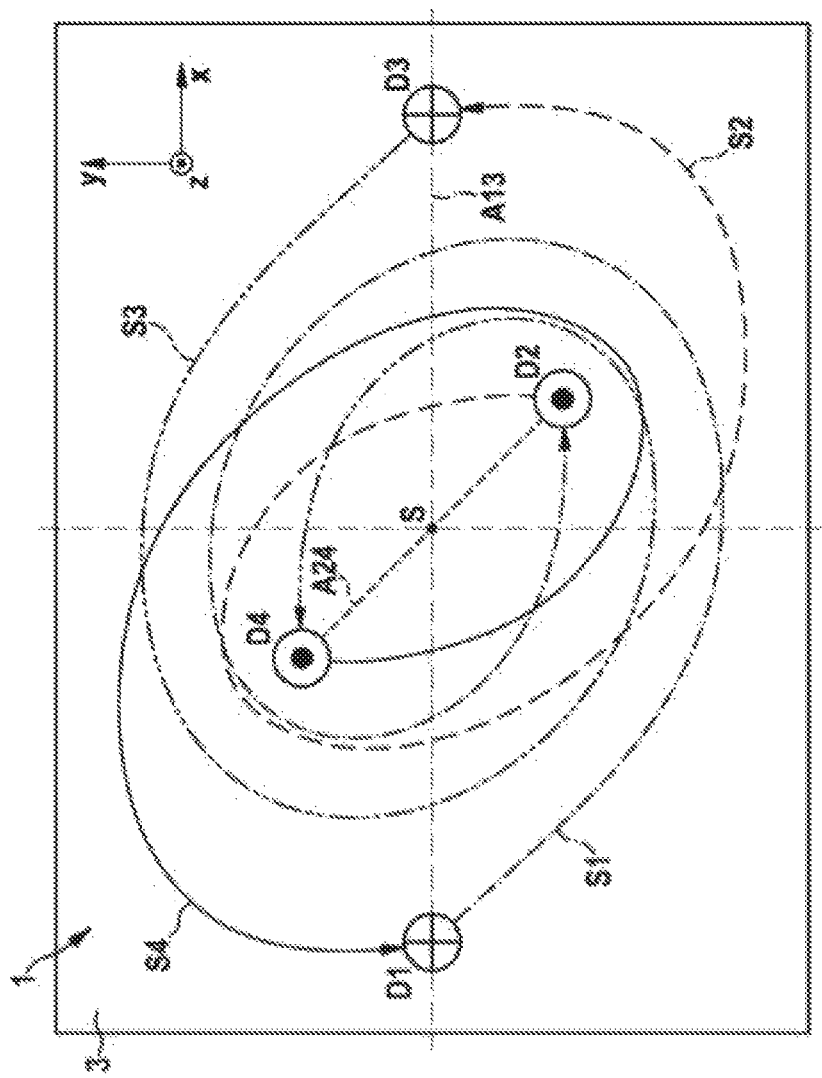
FIG. 6 shows a schematic transparent illustration of the printed circuit board from FIG. 3 having the printed circuit board layers illustrated in FIGS. 4 and 5.

As can further be seen from FIGS. 4 to 6, the first or second layer LS1, LS2 of the printed circuit board 3 can be rotated about the mirror point S in order to construct the actual loops S1, S2, S3, S4 of the coil winding and therefore the electrical links D12, D23, D34, D41 within the first and second layers LS1, LS2. FIG. 4 shows the two loops S1, S3 formed in the first layer LS1 of the printed circuit board 3. In this case, a first loop S1 connects the first via D1 to the second via D2, and a third loop S3 connects the third via D3 to the fourth via D4. FIG. 4 shows the two loops S2, S4 formed in the second layer LS2 of the printed circuit board 3. In this case, a second loop S2 connects the second via D2 to the third via D3, and a fourth loop S4 connects the fourth via D4 to the first via D1. The loops S1, S2, S3, S4 in the two layers LS1, LS2 of the printed circuit board 3 have the same orientation and can be embodied with any desired number of turns. In order to retain the topology, the loops S1, S2, S3, S4 do not have a point of intersection with the connecting line A24 between the vias D2, D4 in the form of upward current paths V2, V3 but only points of intersection with the connecting line A213 between the vias D1, D3 in the form of downward current paths V1, V3.

As has already been indicated above, the coil connections can be arranged at any desired point in the coil winding. As can be seen from FIGS. 7 and 8, the printed circuit board 3 has a connection terminal having at least two connection contacts D5, D6, D7, D8 for making contact with the coil winding. These connection contacts D5, D6, D7, D8 directly produce further magnetic loops Hy3, Hx3, which are compensated for by further loops Hy4, Hx4 oriented in the opposite direction.

Figure 7:
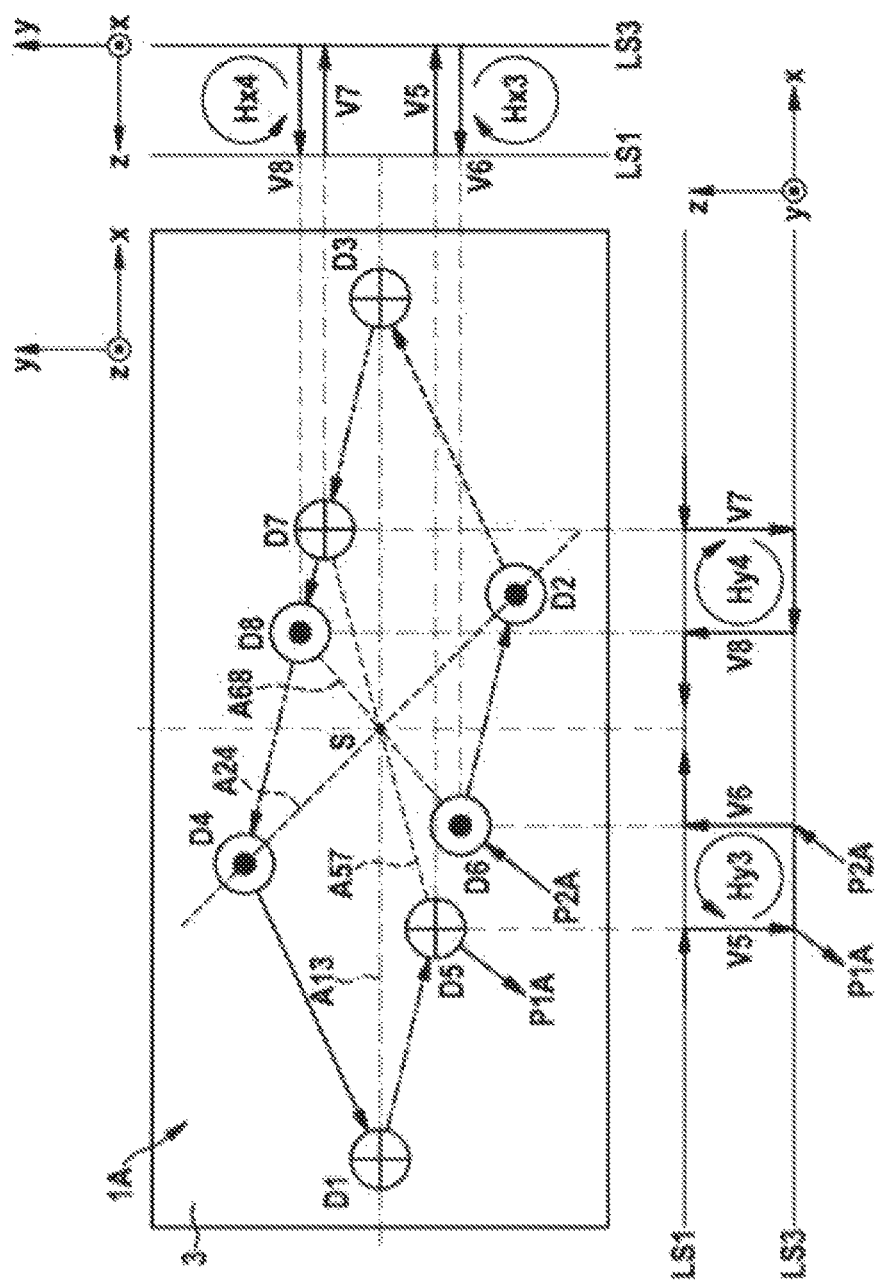
FIG. 7 shows a schematic illustration of a second exemplary embodiment of a printed circuit board for the coil assembly from FIGS. 1 and 2 having a first exemplary embodiment of a connection terminal.

As can further be seen from FIG. 7, the printed circuit board 3 in the first exemplary embodiment of the coil assembly 1A illustrated has a connection terminal having four connection contacts D5, D6, D7, D8, which are each arranged point-symmetrically in pairs with respect to the common mirror point S. The connection contacts D5, D6, D7, D8 of the illustrated connection terminal are formed by four additional vias introduced into the printed circuit board 3. In this case, two connection contacts D5, D7 are in the form of downward current paths V5, V7, and two connection contacts D6, D8 are in the form of upward current paths V6, V8. As can further be seen from FIG. 7, a first connection contact D5 embodied as a downward current path V5 and a second connection contact D6 in the form of an upward current path V6 are each in the form of coil connections P1A, P2A in a third layer LS3 and, in the first layer LS2, loop into the first electrical link D12 between the first via D1 and the second via D2. This means that the first via D1 in the first layer LS1 is electrically connected to the first connection contact D5, and the second connection contact D6 in the first layer LS1 is electrically connected to the second via D2. A third connection contact D7 embodied as a downward current path V7 and a fourth connection contact D8 in the form of an upward current path V8 are each in the form of compensation contacts and, in the first layer LS1, are looped into the corresponding third electrical link D34, mirrored at the common mirror point S, between the third via D3 and the fourth via D4, with the result that magnetic loops Hy3, Hy4, Hx3, Hx4 which are formed in secondary planes (x-z), (y-z) of the printed circuit board 3 which are arranged perpendicular to the main plane (x-y) have opposite directions and compensate for one another. The third connection contact D7 and the fourth connection contact D8 interrupt the first electrical link D13 in the first layer LS1 and, in the third layer LS3, are electrically connected to one another. This means that the third via D3 in the first layer LS1 is electrically connected to the third connection contact D7, and the fourth connection contact D8 in the first layer LS1 is electrically connected to the fourth via D4.

Figure 8:
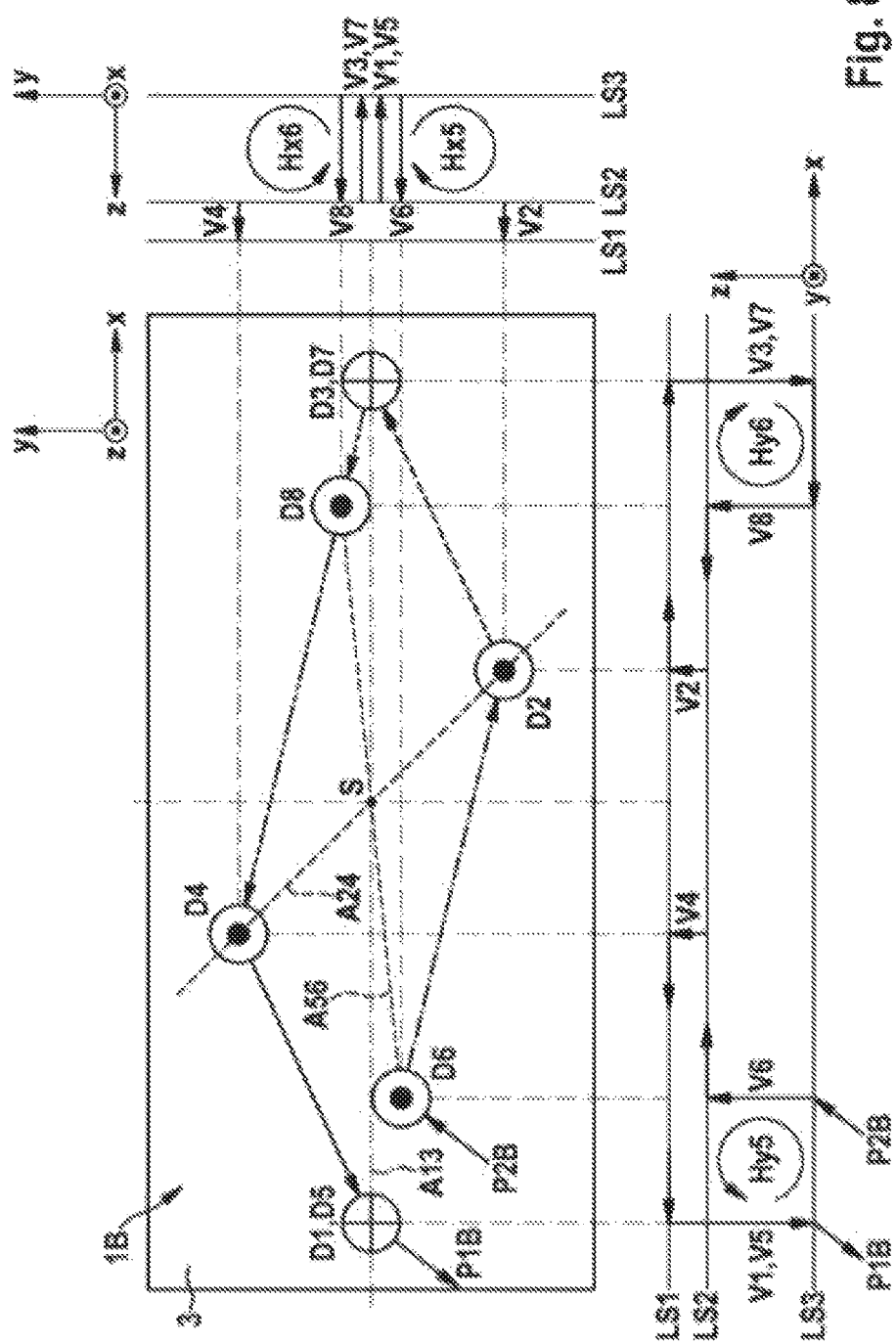
FIG. 8 shows a schematic illustration of a third exemplary embodiment of a printed circuit board for the coil assembly from FIGS. 1 and 2 having a second exemplary embodiment of a connection terminal.

In order to simplify the design and to reduce the number of vias in the printed circuit board 3, vias D1, D2, D3, D4 of the coil winding and connection contacts D5, D6, D7, D8 can be used, as can be seen from FIG. 8.

As can further be seen from FIG. 8, the printed circuit board 3 in the second exemplary embodiment illustrated of the coil assembly 1B, in a similar way to the first exemplary embodiment, has a connection terminal having four connection contacts D5, D6, D7, D8, which are each arranged point-symmetrically in pairs with respect to the common mirror point S. The connection contacts D5, D6, D7, D8 of the illustrated connection terminal are formed by two additional vias introduced into the printed circuit board 3 and by two already existing vias D1, D3 of the coil winding. Therefore, an additional first via and the first via D1 of the coil winding each form a connection contact D5, D8, and a second additional via and the third via D3 of the coil winding each form a compensation contact D7, D8. In a similar way to the first exemplary embodiment, two connection contacts D5, D7 are in the form of downward current paths V5, V7 and two connection contacts D6, D8 are in the form of upward current paths V6, V8. As can further be seen from FIG. 8, the first via D1 embodied as a downward current path V5 at the same time forms the first connection contact D5 and, in a third layer LS3 of the printed circuit board 4, a first coil connection P1B. In the first layer, the first via D1 or first connection contact D5 is electrically connected to the fourth via D4. A second connection contact D6 in the form of an upward current path V6, in the second layer LS2, is looped into the first electrical link D12 between the first via D1 and the second via D2 and, in the third layer LS3, forms a second coil connection P2B. In the second layer LS2, the second connection contact D6 is connected to the second via D2. As can further be seen from FIG. 8, the third via D3 embodied as a downward current path V7 at the same time forms the third connection contact D7 and, in the third layer LS3 of the printed circuit board 4, a first compensation contact. A fourth connection contact D8 in the form of an upward current path V8, in the second layer LS2, is looped into the third electrical link D34 between the third via D3 and the fourth via D4 and forms, in the third layer LS3, a second compensation contact. The third connection contact D7 and the fourth connection contact D8, in the third layer LS3, are electrically connected to one another. In the second layer LS2, the fourth connection contact D8 is connected to the fourth via D4. In the first layer LS1, the second via D1 is connected to the third via D3 or third connection contact D7. As a result, magnetic loops Hy3, Hy4, Hx3, Hx4 which are formed in secondary planes (x-z), (y-z) of the printed circuit board 3 which are arranged perpendicular to the main plane (x-y) have opposite directions and compensate for one another. By combined use of vias, the number of vias is reduced to the cost of complete symmetry for compensation of electrical fields.

Figure 9:
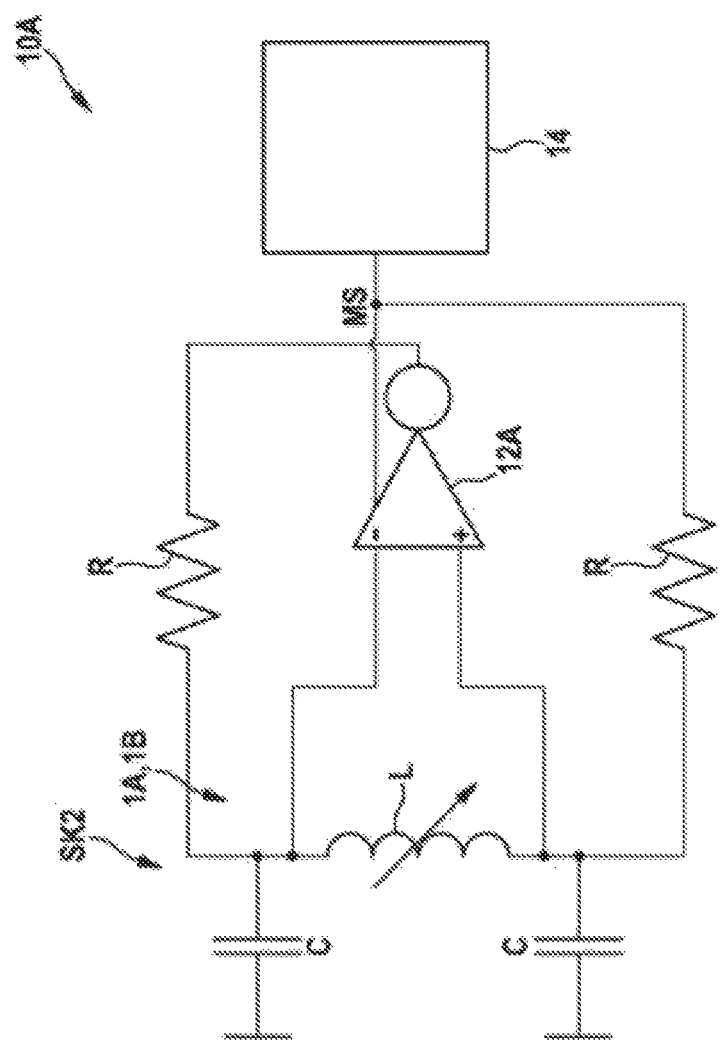
FIG. 9 shows a schematic circuit diagram of a second exemplary embodiment of a measuring assembly having a coil assembly according to the disclosure.
Figure 10:
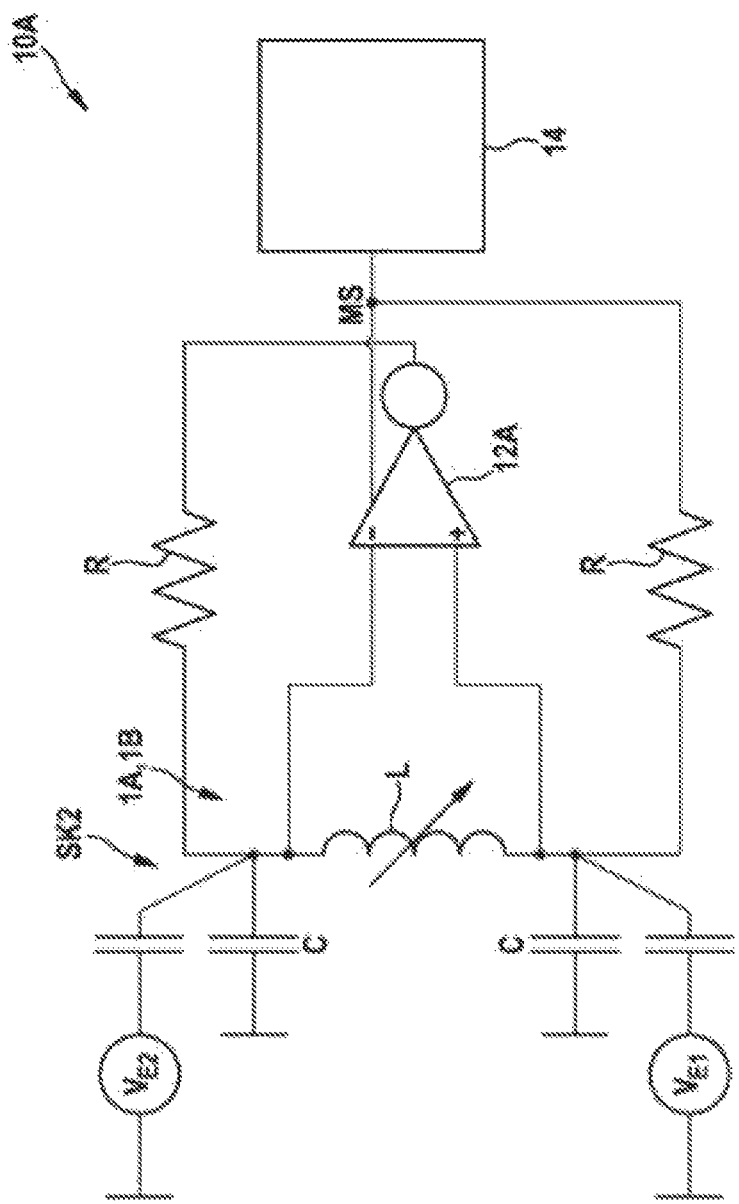
FIG. 10 shows a schematic circuit diagram of the measuring assembly from FIG. 9 having induced interference voltages.

By virtue of the above-described coil assemblies 1, 1A, 1B, the interference voltages $V_H$ induced by magnetic loops Hy1, Hy2, Hy3, Hy4, Hx1, Hx2, Hx3, Hx4 can be reduced virtually to "zero". A remaining problem is the electrical asymmetry of the measuring assembly 10 with different impedances at the terminals of the measuring coil assembly L. FIGS. 9, 10 each show an improved measuring assembly 10A having symmetrical impedances at the terminals of the measuring coil assembly L. Figure shows, in a similar way to FIG. 2, the induced interference voltages $V_H$, $V_{E1}$, $V_{E2}$ in the circuit diagram of the measuring assembly 10A.

As can be seen from FIGS. 9 and 10, the second exemplary embodiment illustrated of a measuring assembly 10A according to the disclosure comprises an amplifier 12A and a resonant circuit SK2, which comprises at least one capacitance C and a measuring coil assembly L. An output signal of the amplifier 12A represents, as measurement signal MS, an inductance and/or change in inductance of the measuring coil assembly L. In the exemplary embodiment illustrated, the resonant circuit SK2 is embodied as a symmetrical Pi-LC network having two capacitances C of equal value, between which the measuring coil assembly L is arranged. The amplifier 12A is embodied as a differential amplifier, whose inverting input is connected to a first side of the resonant circuit SK2, and whose noninverting input is connected to a second side of the resonant circuit SK2. An inverting output is fed back to the first side of the resonant circuit SK2 via a first nonreactive resistance R, and a noninverting output outputs the measurement signal MS, which is fed back to the second side of the resonant circuit SK2 via a second nonreactive resistance R. In the exemplary embodiment illustrated, a meter 14 measures a frequency of the measurement signal MS.

Figure 11:
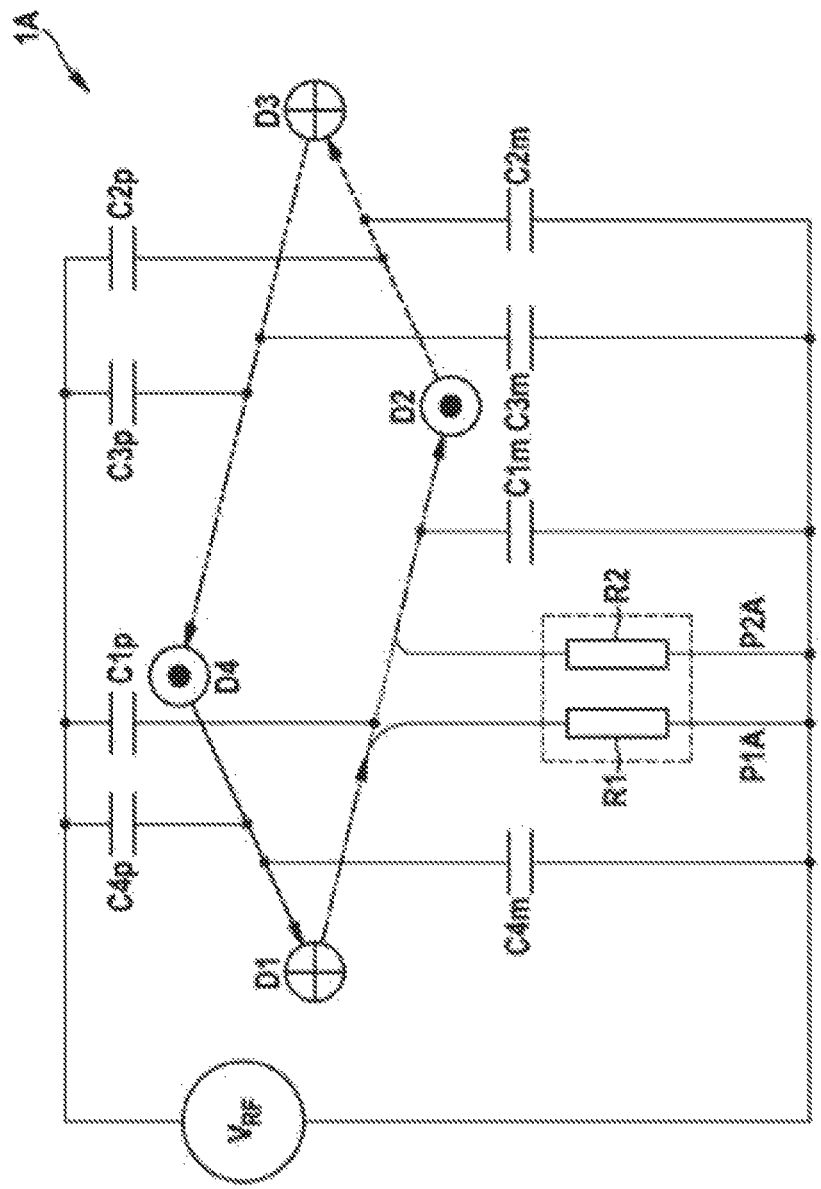
FIG. 11 shows a schematic illustration of a symmetrical coil assembly which is completely compensated in relation to electrical fields.
Figure 12:
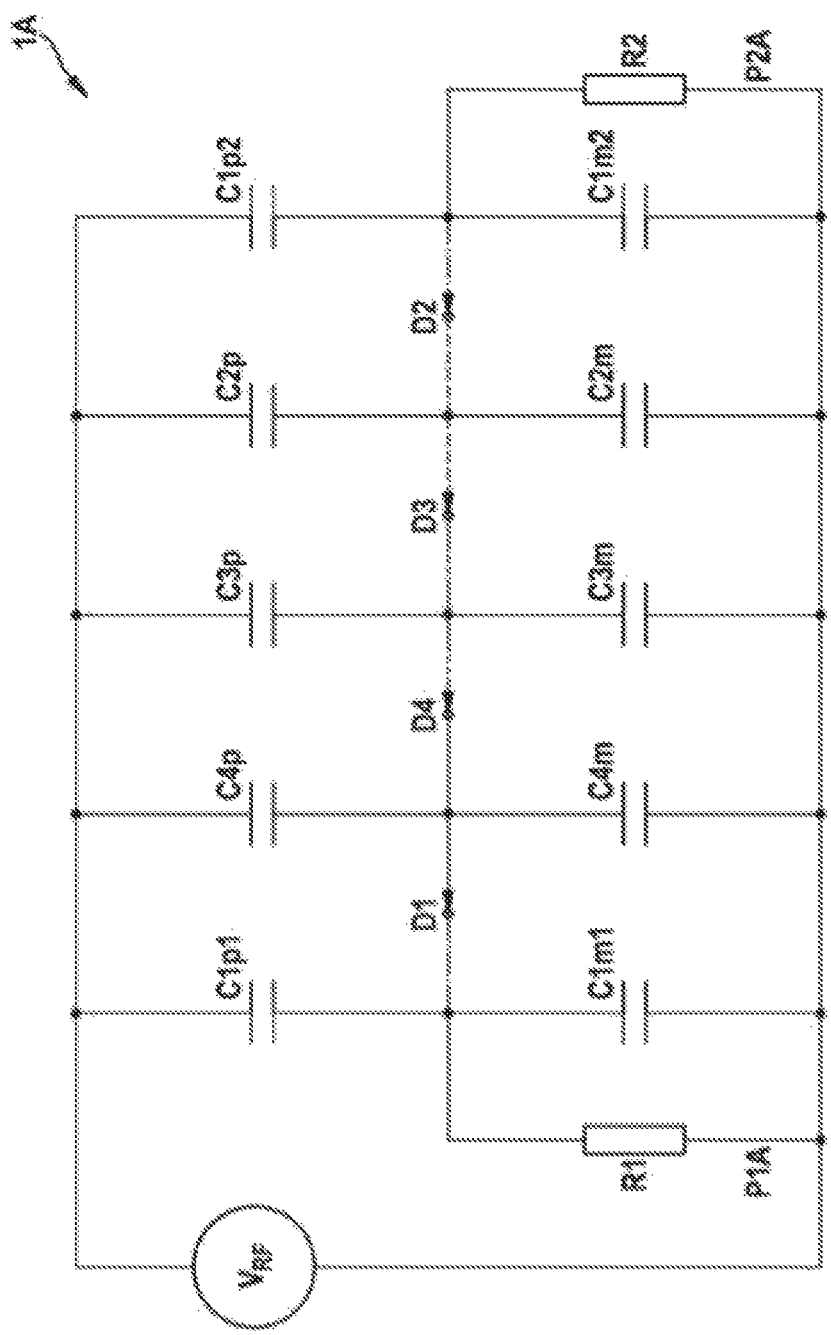
FIG. 12 shows a schematic illustration of the coil assembly illustrated in FIG. 11 in developed form.

FIGS. 11 and 12 each show a schematic illustration of the symmetrical coil assembly 1A from FIG. 7 having the electrical interference fields illustrated as capacitors C1m, C2m, C3m, C4m, C1p, C2p, C3p, C4p. The electrical evaluation circuit at the two coil connections P1A and P2A is illustrated in simplified form by two nonreactive resistances R1, R2. The capacitors C1m, C2m, C3m, C4m, C1p, C2p, C3p, C4p represent the capacitive coupling between an external radiofrequency field ($V_{RF}$) and the coil assembly 1A. The coil assembly 1A illustrated in developed form in FIG. 12 shows the complete symmetry and compensation of the external electrical fields when the measuring assembly 10A shown in FIGS. 9 and 10 is used, wherein the electrical interference fields, which are represented by the capacitors C1p, C1m, are distributed symmetrically among the coil connections P1A, P2A, as is shown by the capacitors C1p1, C1p2, C1m1, C1m2. The capacitors C1m, C2m, C3m, C4m illustrated in FIGS. 11 and 12 symbolize the coupling to the shield, and the capacitors C1p, C2p, C3p, C4p symbolize the coupling to the radiofrequency source $V_{RF}$. In this case, the electrical links which are coupled to the radiofrequency source $V_{RF}$ via the "larger" capacitances C2p, C4p are arranged closer to the radiofrequency source $V_{RF}$ than the electrical links which are coupled to the radiofrequency source $V_{RF}$ via the "smaller" capacitances C1p, C3p. Similarly, the electrical links which are coupled to the shield via the "larger" capacitances C1m, C3m are arranged closer to the shield than the electrical links which are coupled to the shield via the "smaller" capacitances C2m, C4m. The external RF field pairs similar signals in R1 and R2. The electrical interference fields are in this case completely compensated for by the measuring assembly 10A.

Figure 13:
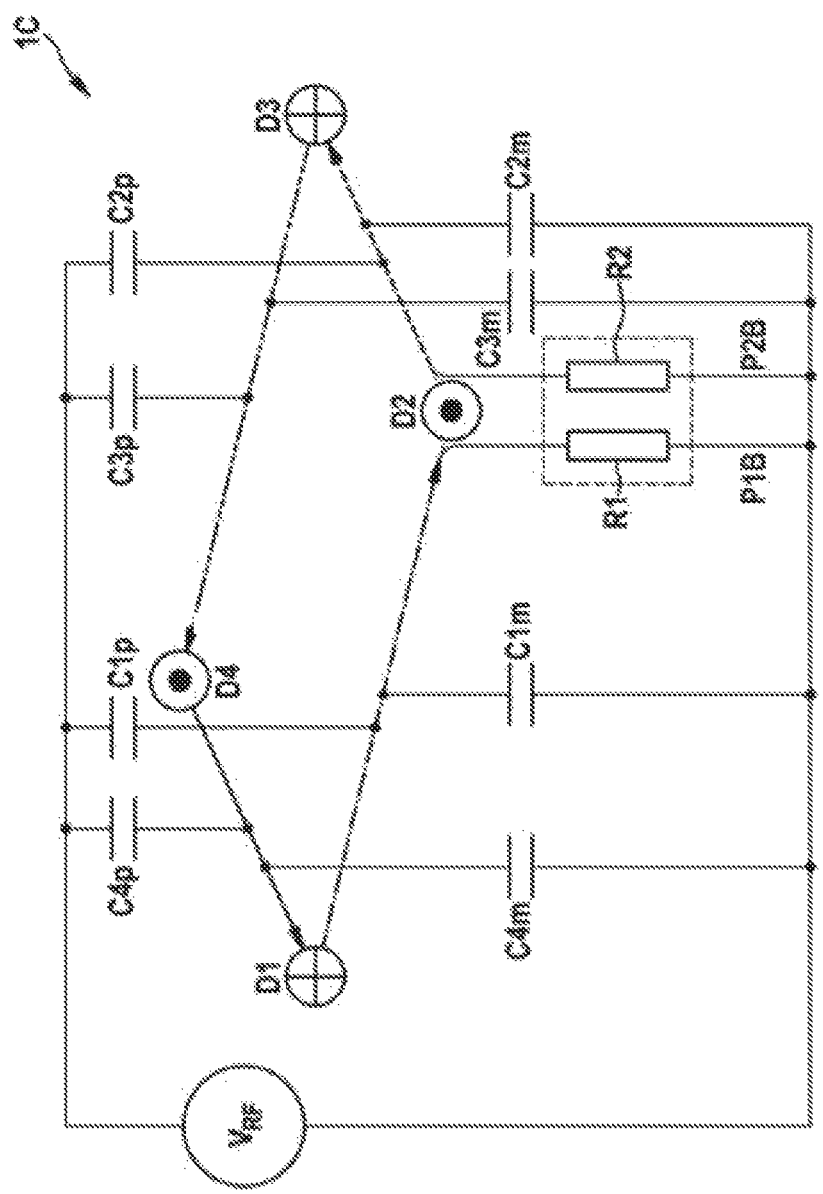
FIG. 13 shows a schematic illustration of an asymmetrical coil assembly.

FIGS. 13 and 14 show the compensation of electrical interference fields illustrated as capacitors C1m, C2m, C3m, C4m, C1p, C2p, C3p, C4p in a nonideal case. FIGS. 13 and 14 each show a schematic illustration of an incompletely symmetrical coil assembly 10. In a similar way to the coil assembly from FIG. 7, the coil assembly 10 has an asymmetry owing to the combined use of the second via D2, as can be seen from FIG. 14. The two coil connections P1B and P2B are connected to two nonreactive resistances R1, R2, in a similar way to the coil assembly 1A from FIGS. 11 and 12. The capacitors C1m, C2m, C3m, C4m, C1p, C2p, C3p, C4p, in a similar way to the coil assembly 1A from FIGS. 11 and 12, represents the capacitive coupling between an external radiofrequency field ($V_{RF}$) and the coil assembly 10. The developed coil assembly 10 illustrated in FIG. 14 shows the asymmetry of the external electrical fields when the measuring assembly 10A shown in FIGS. 9 and 10 is used. Nevertheless, partial compensation of the external electrical interference fields is possible. Thus, the coil connections P1B and P2B can be brought into equilibrium, for example, by an additional compensation capacitor CK1 or other discrete elements.

The invention claimed is:
1. A coil assembly, comprising:
 a multilayered printed circuit board; and
 a coil winding having a plurality of loops, which are arranged in different layers of the printed circuit board and form a main magnetic field that has a main direction perpendicular to a main plane of the printed circuit board, the loops arranged in different layers being connected electrically to one another by at least one via, wherein the printed circuit board has at least four vias or an integer multiple of four vias, which, between the loops of the coil winding, form an identical number of downward current paths and upward current paths, wherein each via of the at least four vias is paired with another via of the at least four vias having a same current path direction, and the paired vias are arranged point-symmetrically with respect to a common mirror point, with the result that magnetic loops which are formed in secondary planes of the printed circuit board which are arranged perpendicular to the main plane have opposite directions and compensate for one another, and wherein the at least four vias are arranged along a common straight line.

2. The coil assembly as claimed in claim 1, wherein the vias arranged point-symmetrically in pairs are mirrored at a center of gravity of the coil assembly as the common mirror point, which is predetermined by a common point of intersection between a plurality of connecting straight lines of the vias arranged point-symmetrically in pairs.

3. The coil assembly as claimed in claim 2, wherein an angle between two of the connecting straight lines has any desired value between 0 and 360°.

4. The coil assembly as claimed in claim 1, wherein the coil winding electrically connects a first via of the at least four vias having a downward current path direction to a second via of the at least four vias having an upward current path direction, and a third via of the at least four vias having the upward current path direction to a fourth via of the at least four vias having the downward current path direction.

5. A The coil assembly, wherein comprising:
a multilayered printed circuit board; and
a coil winding having a plurality of loops, which are arranged in different layers of the printed circuit board and form a main magnetic field that has a main direction perpendicular to a main plane of the printed circuit board, the loops arranged in different layers being connected electrically to one another by at least one via,
wherein the printed circuit board has at least four vias or an integer multiple of four vias, which, between the loops of the coil winding, form an identical number of downward current paths and upward current paths,
wherein each via of the at least four vias is paired with another via of the at least four vias having a same current path direction, and the paired vias are arranged point-symmetrically with respect to a common mirror point, with the result that magnetic loops which are formed in secondary planes of the printed circuit board which are arranged perpendicular to the main plane have opposite directions and compensate for one another,
wherein at least one first loop of the plurality of loops, in a first layer of the printed circuit board, electrically connects a first via of the at least four vias having a downward current path direction to a second via of the at least four vias having an upward current path direction,
wherein at least one second loop of the plurality of loops, in a second layer of the printed circuit board, electrically connects the second via to a third via having the downward current path direction,
wherein at least one third loop of the plurality of loops, in the first layer of the printed circuit board, electrically connects the third via to a fourth via having the upward current path direction, and wherein at least one fourth loop of the plurality of loops, which, in the second layer of the printed circuit board, electrically connects the fourth via to the first via.

6. The coil assembly as claimed in claim 5, wherein:
the electrical connections between the vias have any desired number of loops of the plurality of loops, and
the loops of the desired number of loop do not have a point of intersection with a connecting straight line between the vias having the upward current direction.

7. The coil assembly as claimed in claim 5, wherein the at least four vias are arranged along a common straight line.

8. The coil assembly as claimed in claim 5, wherein the at least four vias includes only the first via, the second via, the third via, and the fourth via.

9. The coil assembly as claimed in claim 8, wherein the first via, the second via, the third via, and the fourth via are arranged point-symmetrically in pairs and are mirrored at a center of gravity of the coil assembly as the common mirror point, which is predetermined by a common point of intersection between a plurality of connecting straight lines of the vias arranged point-symmetrically in pairs.

10. A coil assembly comprising:
a multilayered printed circuit board; and
a coil winding having a plurality of loops, which are arranged in different layers of the printed circuit board and form a main magnetic field that has a main direction perpendicular to a main plane of the printed circuit board, the loops arranged in different layers being connected electrically to one another by at least one via,
wherein the printed circuit board has at least four vias or an integer multiple of four vias, which, between the loops of the coil winding, form an identical number of downward current paths and upward current paths,
wherein each via of the at least four vias is paired with another via of the at least four vias having a same current path direction, and the paired vias are arranged point-symmetrically with respect to a common mirror point, with the result that magnetic loops which are formed in secondary planes of the printed circuit board which are arranged perpendicular to the main plane have opposite directions and compensate for one another,
wherein the at least four vias are arranged along a common straight line,
wherein the printed circuit board has a connection terminal having four connection contacts, which are each arranged point-symmetrically in pairs with respect to the common mirror point,
wherein two connection contacts of the four connection contacts include the downward current paths, and
wherein two other connection contacts of the four connection contacts include the upward current paths.

11. The coil assembly as claimed in claim 10, wherein:
a first connection contact of the four connection contacts is one of the downward current paths and a second connection contact of the four connection contacts is one of the upward current paths,
the first connection contact and the second connection contact are coil connections located in a third layer of the printed circuit board,
a third connection contact of the four connection contacts is one of the downward current paths and a fourth connection contact of the four connection contacts is one of the upward current paths, and
the third connection contact and the fourth connection contact are each configured as a compensation contact.

12. The coil assembly as claimed in claim 11, wherein the first connection contact and the second connection contact are looped into a first link between two vias and interrupt said link, wherein the third connection contact and the fourth connection contact are looped into a corresponding link, mirrored at the common mirror point, between two vias and interrupt the link, and wherein the third connection contact and the fourth connection contact are connected electrically to one another in a third layer.

13. The coil assembly as claimed in claim 10, wherein the connection terminal has four additional vias, which form the connection contacts.

14. The coil assembly as claimed in claim 10, wherein:
the connection terminal has a first additional via and a second additional via,
the first additional via and one of the vias of the at least four vias of the coil winding form a connection contact, and
the second an additional via and another one of the vias of the at least four vias of the coil winding form a compensation contact.

15. A measuring assembly, comprising:
an amplifier and a resonant circuit, which comprises at least one capacitance and a measuring coil assembly,
wherein an output signal of the amplifier represents, as measurement signal, one or more of an inductance and change in inductance of the measuring coil assembly, and
wherein the measuring coil assembly is embodied as a coil assembly that includes:
a multilayered printed circuit board, and
a coil winding having a plurality of loops, which are arranged in different layers of the printed circuit board and form a main magnetic field that has a main direction perpendicular to a main plane of the printed circuit board, the loops arranged in different layers being connected electrically to one another by at least one via,
wherein the printed circuit board has at least four vias or an integer multiple of four vias, which, between the loops of the coil winding, form an identical number of downward current paths and upward current paths,
wherein each via is paired with another via having a same current path direction, and the paired vias are arranged point-symmetrically with respect to a common mirror point, with the result that magnetic loops which are formed in secondary planes of the printed circuit board which are arranged perpendicular to the main plane have opposite directions and compensate for one another, and
wherein the at least four vias are arranged along a common straight line.

16. The measuring assembly as claimed in claim 15, wherein the resonant circuit is embodied as a Pi-LC oscillator having two capacitances, between which the measuring coil assembly is arranged.

17. The measuring assembly as claimed in claim 15, wherein the amplifier is embodied as an inverter having an input connected to a first side of the resonant circuit, and an inverting output configured to output the measurement signal, which is fed back to a second side of the resonant circuit via a nonreactive resistance.

18. The measuring assembly as claimed in claim 15, wherein:
the amplifier is embodied as a differential amplifier having an inverting input connected to a first side of the resonant circuit, and a noninverting input connected to a second side of the resonant circuit, and an inverting output of the differential amplifier is fed back to the first side of the resonant circuit by a first nonreactive resistance, and a noninverting output of the differential amplifier outputs the measurement signal, which is fed back to the second side of the resonant circuit by a second nonreactive resistance.

19. The measuring assembly as claimed in claim 15, wherein a meter measures a frequency of the measurement signal.

* * * * *

UNITED STATES PATENT AND TRADEMARK OFFICE
CERTIFICATE OF CORRECTION

| | |
|---|---|
| PATENT NO. | : 11,268,832 B2 |
| APPLICATION NO. | : 16/314426 |
| DATED | : March 8, 2022 |
| INVENTOR(S) | : Buck et al. |

It is certified that error appears in the above-identified patent and that said Letters Patent is hereby corrected as shown below:

In the Claims

In Claim 5, at Column 11, Line 33: "A The coil assembly, wherein comprising:" should read --The coil assembly, comprising:--.

In Claim 5, at Column 12, Lines 1-2: "wherein at least one fourth loop of the plurality of loops, which, in the second layer of the printed circuit board," should read --wherein at least one fourth loop of the plurality of loops, in the second layer of the printed circuit board,--.

Signed and Sealed this
Twentieth Day of September, 2022

Katherine Kelly Vidal
*Director of the United States Patent and Trademark Office*